United States Patent
Yan et al.

(10) Patent No.: US 11,121,226 B2
(45) Date of Patent: Sep. 14, 2021

(54) THIN FILM TRANSISTOR AND METHOD FOR MANUFACTURING THE SAME, ARRAY SUBSTRATE AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lei Yan, Beijing (CN); Feng Li, Beijing (CN); Yezhou Fang, Beijing (CN); Jun Fan, Beijing (CN); Lei Li, Beijing (CN); Yanyan Meng, Beijing (CN); Lei Yao, Beijing (CN); Jinjin Xue, Beijing (CN); Chenglong Wang, Beijing (CN); Jinfeng Wang, Beijing (CN); Lin Hou, Beijing (CN); Zhixuan Guo, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/632,179

(22) PCT Filed: Jan. 29, 2019

(86) PCT No.: PCT/CN2019/073580
§ 371 (c)(1),
(2) Date: Jan. 17, 2020

(87) PCT Pub. No.: WO2020/154876
PCT Pub. Date: Aug. 6, 2020

(65) Prior Publication Data
US 2021/0020755 A1    Jan. 21, 2021

(51) Int. Cl.
*H01L 29/417* (2006.01)
*H01L 29/66* (2006.01)
(Continued)

(52) U.S. Cl.
CPC .. *H01L 29/41733* (2013.01); *H01L 29/66757* (2013.01); *H01L 29/78618* (2013.01);
(Continued)

(58) Field of Classification Search
CPC ......... H01L 29/41733; H01L 29/66757; H01L 29/78633; H01L 29/78618; H01L 27/3248;
(Continued)

(56) References Cited

U.S. PATENT DOCUMENTS

2016/0240687 A1\* 8/2016 Hu ........................ H01L 29/06
2018/0130130 A1   5/2018 Dechu et al.
(Continued)

FOREIGN PATENT DOCUMENTS

CN    105094956 A    11/2015
CN    105785676 A    7/2016
(Continued)

*Primary Examiner* — Mohammed R Alam
(74) *Attorney, Agent, or Firm* — The Webb Law Firm

(57) ABSTRACT

The present disclosure provides a thin film transistor and a method for manufacturing the same, an array substrate, and a display device. The thin film transistor includes: an active layer located on one side of the substrate; a first interlayer dielectric layer located on one side of the active layer away from the substrate; a source penetrating through the first interlayer dielectric layer, and connected to the active layer; a second interlayer dielectric layer located on one side of the first interlayer dielectric layer away from the active layer and covering the source; and a drain, wherein the drain comprises a first portion penetrating through the second
(Continued)

interlayer dielectric layer and the first interlayer dielectric layer and connected to the active layer.

15 Claims, 6 Drawing Sheets

(51) Int. Cl.
  *H01L 29/786* (2006.01)
  *G02F 1/1343* (2006.01)
  *G02F 1/1362* (2006.01)
  *H01L 27/12* (2006.01)
  *H01L 27/32* (2006.01)

(52) U.S. Cl.
  CPC .. *H01L 29/78633* (2013.01); *G02F 1/134363* (2013.01); *G02F 1/136227* (2013.01); *H01L 27/124* (2013.01); *H01L 27/3248* (2013.01)

(58) Field of Classification Search
  CPC ............. H01L 27/124; G02F 1/134363; G02F 1/136227
  See application file for complete search history.

(56) References Cited

U.S. PATENT DOCUMENTS

| | | | |
|---|---|---|---|
| 2018/0149933 | A1 | 5/2018 | Wang |
| 2018/0151654 | A1 | 5/2018 | Lee |
| 2019/0079331 | A1* | 3/2019 | Miyamoto .......... H01L 27/1248 |
| 2019/0081077 | A1* | 3/2019 | Suzuki .............. H01L 29/42384 |
| 2020/0052129 | A1* | 2/2020 | Miyake ............... H01L 27/1225 |

FOREIGN PATENT DOCUMENTS

| | | |
|---|---|---|
| CN | 106020544 A | 10/2016 |
| CN | 107134474 A | 9/2017 |
| CN | 107909358 A | 4/2018 |
| CN | 107948300 A | 4/2018 |
| CN | 108011370 A | 5/2018 |
| CN | 108092412 A | 5/2018 |
| CN | 108122928 A | 6/2018 |
| CN | 108171430 A | 6/2018 |
| CN | 108306292 A | 7/2018 |
| CN | 108400589 A | 8/2018 |
| CN | 108400590 A | 8/2018 |
| CN | 108492105 A | 9/2018 |
| CN | 108830110 A | 11/2018 |
| EP | 3764302 A1 | 1/2021 |
| EP | 3805972 A1 | 4/2021 |

* cited by examiner

THIN FILM TRANSISTOR AND METHOD FOR MANUFACTURING THE SAME, ARRAY SUBSTRATE AND DISPLAY DEVICE

CROSS-REFERENCE TO RELATED APPLICATIONS

The present application is a U.S. National Stage Application under 35 U.S.C. § 371 of International Patent Application No. PCT/CN2019/073580, filed on Jan. 29, 2019, the disclosure of which is incorporated by reference herein in its entirety.

TECHNICAL FIELD

The present disclosure relates to the field of display technology, and in particularly, to a thin film transistor and a method for manufacturing the same, an array substrate, and a display device.

BACKGROUND

In order to meet the high-resolution display requirements, the PPI (Pixels Per Inch) of the display panel needs to be higher and higher. In particularly, display products based on VR (Virtual Reality) technology have stricter requirements on resolution.

SUMMARY

According to one aspect of embodiments of the present disclosure, a thin film transistor is provided. The thin film transistor comprises: an active layer located on one side of a substrate; a first interlayer dielectric layer located on one side of the active layer away from the substrate; a source penetrating through the first interlayer dielectric layer, and connected to the active layer; a second interlayer dielectric layer located on one side of the first interlayer dielectric layer away from the active layer and covering the source; and a drain, wherein the drain comprises a first portion penetrating through the second interlayer dielectric layer and the first interlayer dielectric layer and connected to the active layer.

In some embodiments, the drain further comprises: a second portion connected to the first portion and located on one side of the second interlayer dielectric layer away from the first interlayer dielectric layer, wherein the second portion is configured to be connected to a first electrode.

In some embodiments, an orthographic projection of the second portion of the drain on the substrate partially overlaps with an orthographic projection of the source on the substrate.

In some embodiments, the second portion of the drain extends on a surface of the second interlayer dielectric layer in a direction towards the source.

In some embodiments, the active layer defines at least one of a first recess or a second recess, wherein: the source is in contact with a bottom surface and a side surface of the first recess, and the first portion of the drain is in contact with a bottom surface and a side surface of the second recess.

In some embodiments, the thin film transistor further comprises a buffer layer located between the substrate and the active layer, wherein at least one of the source or the first portion of the drain extends into the buffer layer.

In some embodiments, the thin film transistor further comprises: a light shielding layer located between the substrate and the buffer layer; wherein an orthographic projection of the active layer on the substrate overlaps with an orthographic projection of the light shielding layer on the substrate.

In some embodiments, the thin film transistor comprises a gate dielectric layer and a gate, wherein: the gate dielectric layer is located on one side of the active layer away from the substrate; the gate is located on one side of the gate dielectric layer away from the active layer; and the first interlayer dielectric layer is located on one side of the gate dielectric layer away from the substrate and covers the gate.

In some embodiments, a material of the active layer comprises polysilicon.

According to another aspect of embodiments of the present disclosure, an array substrate is provided. The array substrate comprises: the thin film transistor according to any one of the above embodiments.

In some embodiments, the array substrate further comprises: a planarization layer located on one side of the second interlayer dielectric layer of the thin film transistor away from the first interlayer dielectric layer, wherein the planarization layer defines an opening extending to a second portion of the drain of the thin film transistor; and a first electrode at least partially located in the opening and in contact with the second portion of the drain.

In some embodiments, the first electrode is a pixel electrode; wherein the array substrate further comprises: an insulation layer located on one side of the first electrode away from the second portion of the drain; and a common electrode located on one side of the insulation layer away from the first electrode.

In some embodiments, the first electrode is an anode.

According to a still another aspect of embodiments of the present disclosure, a display device is provided. The display device comprises: the array substrate according to any one of the above embodiments.

According to yet still another aspect of embodiments of the present disclosure, a method for manufacturing a thin film transistor is provided. The method comprises: forming an active layer located on one side of a substrate; forming a first interlayer dielectric layer located on one side of the active layer away from the substrate; forming a source penetrating through the first interlayer dielectric layer and connected to the active layer; forming a second interlayer dielectric layer located on one side of the first interlayer dielectric layer away from the active layer and covering the source; and forming a drain, wherein the drain comprises a first portion penetrating through the second interlayer dielectric layer and the first interlayer dielectric layer and connected to the active layer.

In some embodiments, forming the source penetrating through the first interlayer dielectric layer and connected to the active layer comprises: forming a first opening penetrating through the first interlayer dielectric layer, wherein the first opening exposes a part of the active layer; forming the source at least partially located in the first opening and in contact with the active layer.

In some embodiments, forming the drain comprises: forming a second opening penetrating through the second interlayer dielectric layer and the first interlayer dielectric layer, wherein the second opening exposes a part of the active layer; forming the drain, wherein the first portion of the drain is located in the second opening and in contact with the active layer.

In some embodiments, forming the active layer located on the one side of the substrate comprises: forming a buffer layer located on the one side of the substrate; forming the active layer on one side of the buffer layer away from the substrate; wherein at least one of the source or the first portion of the drain extends into the buffer layer.

In some embodiments, forming the buffer layer located on the one side of the substrate comprises: forming a light shielding layer located on the one side of the substrate; forming the buffer layer located on the one side of the substrate and covering the light shielding layer; wherein an orthographic projection of the active layer on the substrate at least partially overlaps with an orthographic projection of the light shielding layer on the substrate.

In some embodiments, the method further comprises: forming a gate dielectric layer on one side of the active layer away from the substrate after forming the active layer located on the one side of the substrate; and forming a gate on one side of the gate dielectric layer away from the active layer; wherein the first interlayer dielectric layer is located on one side of the gate dielectric layer away from the substrate and covers the gate.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
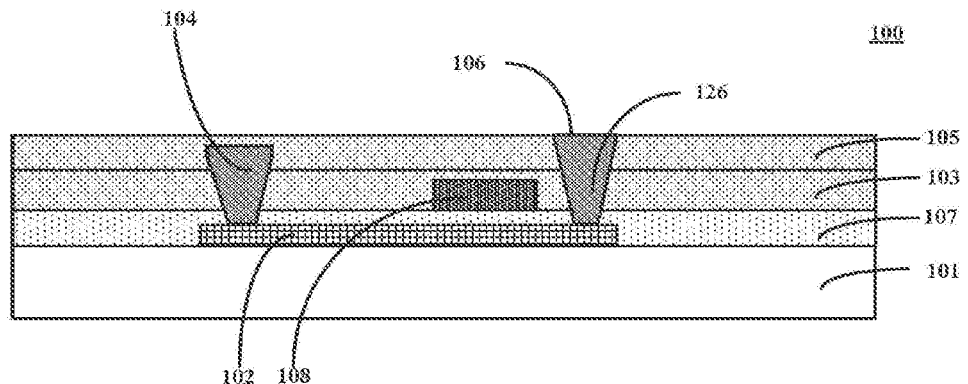
FIG. 1 is a schematic structural view showing a thin film transistor according to one embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

When there is a large PPI, the pitch between adjacent sub-pixels needs to be small. The inventors have noticed that, since the pitch between adjacent sub-pixels is small, when the source and the drain of the thin-film transistor in each sub-pixel are formed, the source and the drain are easily lap jointed, which results in a poor reliability of the thin-film transistor, thereby producing a poor display phenomenon such as dark spots, and affecting the display effect.

To this end, the embodiments of the present disclosure propose the following technical solution.

FIG. 1 is a schematic structural view showing a thin film transistor according to one embodiment of the present disclosure.

As shown in FIG. 1, the thin film transistor 100 comprises an active layer 102 located on one side of the substrate 101, a first interlayer dielectric layer 103, a source 104, a second interlayer dielectric layer 105, and a drain 106.

The substrate 101 may be, for example, a glass substrate. However, the present disclosure is not limited thereto. For example, in some embodiments, the substrate 101 may also be a flexible substrate such as a polyimide (PI) substrate.

The active layer 102 is located on one side, such as an upper side, of the substrate 101. In some embodiments, the material of the active layer 102 may comprise polysilicon, such as Low Temperature Poly-silicon (LTPS). In other embodiments, the material of the active layer 102 may comprise oxide semiconductor.

The first interlayer dielectric layer 103 is located on one side of the active layer 102 away from the substrate 101. For example, the material of the first interlayer dielectric layer 103 may comprise silicon oxide, silicon nitride, silicon oxynitride, and the like.

The source 104 penetrates through the first interlayer dielectric layer 103, and is connected to the active layer 102. The source 104 may be, for example, a stack of Ti/Al/Ti. In some embodiments, the source 104 may be in contact with a surface (which may also be referred to as an upper surface) on one side of the active layer 102 away from the substrate 101.

The second interlayer dielectric layer 105 is located on one side of the first interlayer dielectric layer 103 away from the active layer 102 and covers the source 104. The material of the second interlayer dielectric layer 105 may be the same as or different from that of the first interlayer dielectric layer 103. For example, the material of the second interlayer dielectric layer 105 may comprise silicon oxide, silicon nitride, silicon oxynitride, and the like.

The drain 106 comprises a first portion 116. The first portion 116 penetrates through the second interlayer dielectric layer 105 and the first interlayer dielectric layer 103 and is connected to the active layer 102. In some embodiments, the first portion 116 may be in contact with a surface of the active layer 102 away from the substrate 101. As some examples, the first portion 116 may be a stack of Ti/Al/Ti. It should be understood that, the thin film transistor 100 also comprises a gate dielectric layer and a gate. In some embodiments, the thin film transistor 100 may be a top-gate type thin film transistor. In other embodiments, the thin film transistor 100 may be a bottom-gate type thin film transistor. In the case where the thin film transistor 100 is a top-gate type thin film transistor, as shown in FIG. 1, the gate dielectric layer 107 is located on one side of the active layer 102 away from the substrate 101, the gate 108 is located on one side of the gate dielectric layer 107 away from the active layer 102, and the first interlayer dielectric layer 103 is located on one side of the gate dielectric layer 107 away from the substrate 101 and covers the gate 108. In some embodiments, the gate dielectric layer 107 may cover the active layer 102.

In the above embodiments, the source 104 penetrates through the first interlayer dielectric layer 103, the second interlayer dielectric layer 105 covers the source 104, and the first portion 116 of the drain 106 penetrates through the second interlayer dielectric layer 105. In such a thin film transistor, the source 104 and the drain 106 are located in different layers and will not overlap even if they are arranged close to each other in a direction parallel to the surface of the substrate 101, thereby improving the reliability of the thin film transistor. In the case where the thin film transistor is applied to a display panel, the occurrence of a poor display phenomenon such as dark spots caused by the overlap between the source and the drain is reduced, thereby improving the display effect of the display panel.

Figure 2:
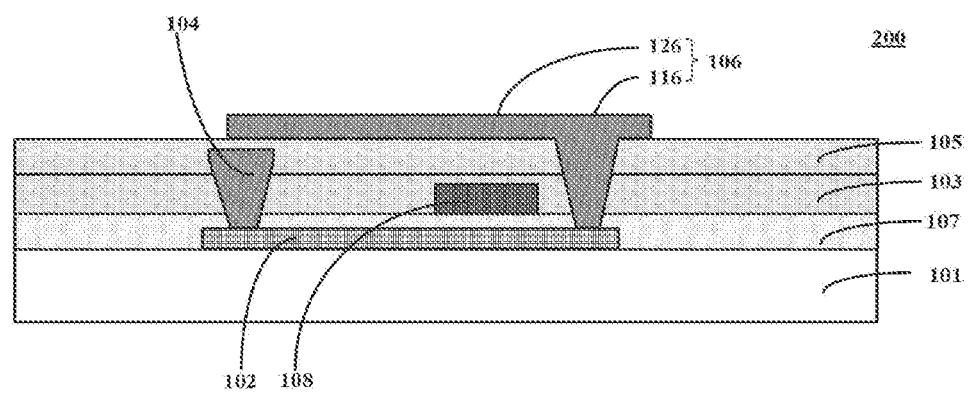
FIG. 2 is a schematic structural view showing a thin film transistor according to another embodiment of the present disclosure.

FIG. 2 is a schematic structural view showing a thin film transistor according to another embodiment of the present disclosure.

Compared to the thin film transistor 100 shown in FIG. 1, the drain 106 in the thin film transistor 200 shown in FIG. 2 further comprises a second portion 126 connected to the first portion 116. The second portion 126 is located on one side of the second interlayer dielectric layer 105 away from the first interlayer dielectric layer 103. The second portion 126 is configured to be connected to a first electrode. Here, the first electrode may be, for example, a pixel electrode or an anode.

In some embodiments, the orthographic projection of the second portion 126 of the drain 106 on the substrate 101 partially overlaps with that of the source 104 on the substrate 101, thereby helping to reduce the size of the thin film transistor. In some embodiments, the second portion 126 of the drain 106 extends on the surface of the second interlayer dielectric layer 105 towards the source 104 instead of extending away from the source 104, thereby helping to further reduce the size of the thin film transistor.

In the above embodiments, the drain 106 further comprises a second portion 126 configured to be connected to the first electrode. The second interlayer dielectric layer 105 covers the source 104, and the second portion 126 of the drain 106 is located on one side of the second interlayer dielectric layer 105 away from the first interlayer dielectric layer 103. Such a thin film transistor makes the contact between the first electrode and the drain 106 more reliable. In addition, the source 104 and the second portion 126 of the drain 106 are located in different layers and will not overlap even if they are arranged close to each other in the direction parallel to the surface of the substrate 101, thereby improving the reliability of the thin film transistor. In the case where a thin film transistor is applied to a display panel, the occurrence of a poor display phenomenon such as dark spots caused by the overlap between the source and drains is reduced, thereby improving the display effect of the display panel.

Figure 3:
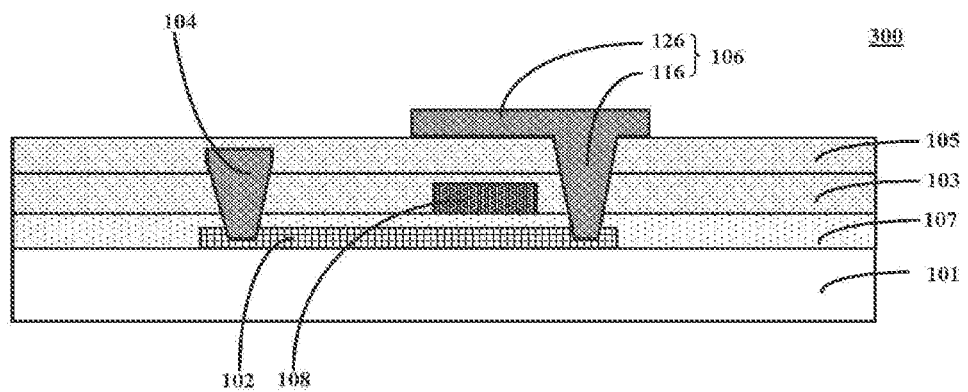
FIG. 3 is a schematic structural view showing a thin film transistor according to still another embodiment of the present disclosure.

FIG. 3 is a schematic structural view showing a thin film transistor according to still another embodiment of the present disclosure.

Compared to the thin film transistor 200 shown in FIG. 2, the active layer 102 in the thin film transistor 300 shown in FIG. 3 may define at least one of a first recess or a second recess. Here, the source 104 is in contact with the bottom surface and the side surface(s) of the first recess, and the first portion 116 of the drain 106 is in contact with the bottom surface and the side surface(s) of the second recess. Such a thin film transistor may increase the contact area between the active layer 102 and at least one of the source 104 or the first portion 116 of the drain 106, thereby reducing a corresponding contact resistance.

Figure 4:
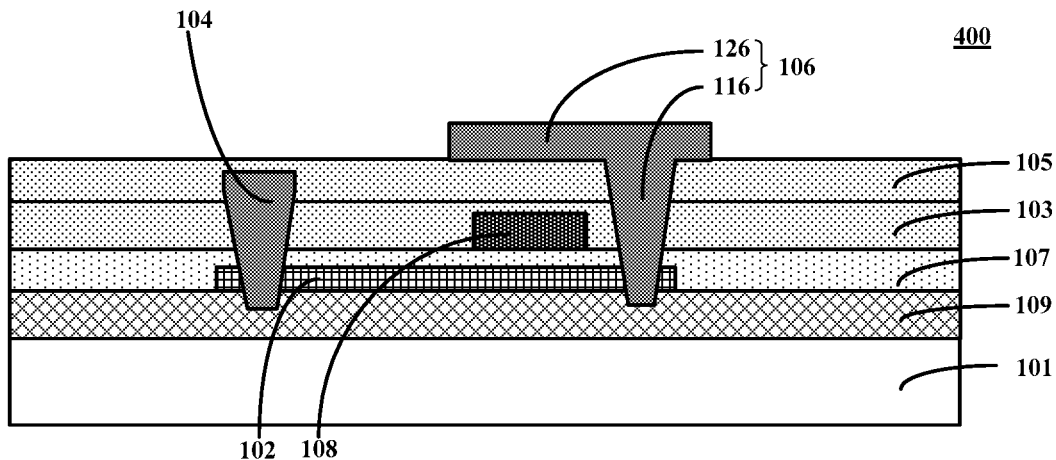
FIG. 4 is a schematic structural view showing a thin film transistor according to yet still another embodiment of the present disclosure.

FIG. 4 is a schematic structural view showing a thin film transistor according to yet still another embodiment of the present disclosure.

Compared to the thin film transistor 300 shown in FIG. 3, the thin film transistor 400 shown in FIG. 4 further comprises a buffer layer 109 located between the substrate 101 and the active layer 102. In some embodiments, the buffer layer 109 may comprise, for example, a nitride layer of silicon and an oxide layer of silicon. The nitride layer of silicon is located between the substrate 101 and the oxide layer of silicon, and the oxide layer of silicon is located between the nitride layer of silicon and the active layer 102. The nitride layer of silicon may block metal ions such as sodium ion and potassium ion in the substrate 101 from entering the active layer 102, thereby preventing the metal ions from adversely affecting the performance of the active layer 102. The oxide layer of silicon, on one hand, has a favorable interface performance with the active layer 102, and on the other hand, functions as a heat insulator. For example, the active layer 102 is polycrystalline silicon transformed from amorphous silicon by excimer laser annealing (ELA). When the amorphous silicon is irradiated with a laser light, the oxide layer of silicon may block the heat from transferring downward. Thus, the amorphous silicon can be more effectively transformed into polysilicon.

At least one of the source 104 or the first portion 116 of the drain 106 may penetrate through the active layer 102 and extend into the buffer layer 109, for example, into the oxide layer of silicon in the buffer layer 109. For example, a part of the source 104 is embedded in the buffer layer 109. For another example, a part of the first portion 116 is embedded in the buffer layer 109. For another example, a part of the source 104 and a part of the first portion 116 are both embedded in the buffer layer 109.

Figure 5:
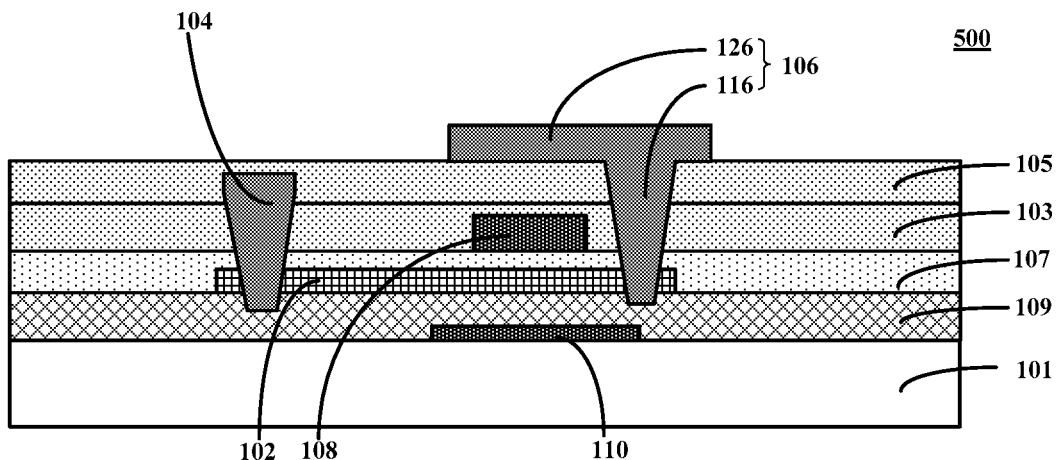
FIG. 5 is a schematic structural view showing a thin film transistor according to a further embodiment of the present disclosure.

FIG. 5 is a schematic structural view showing a thin film transistor according to a further embodiment of the present disclosure.

Compared to the thin film transistor 400 shown in FIG. 4, the thin film transistor 500 shown in FIG. 5 further comprises a light shielding layer 110 located between the substrate 101 and the buffer layer 109. Here, the orthographic projection of the active layer 102 on the substrate 101 at least partially overlaps with that of the light shielding layer 110 on the substrate 101. In some embodiments, the material of the light shielding layer 110 may comprise a metal material having a light shielding performance such as molybdenum.

The light shielding layer 110 may block a light from one side of the substrate 101 away from the active layer 102 (for example, a light emitted by a backlight module in the case where the thin film transistor is applied to a liquid crystal display panel) to reduce the current produced by the active layer 102 under the irradiation of the light, thereby reducing a leakage current of the thin film transistor 400.

It should be noted that, although the drain 106 shown in FIGS. 3-5 comprises the second portion 126, this is not restrictive. In some embodiments, the drain 106 may also exclude the second portion 126.

Figure 6:
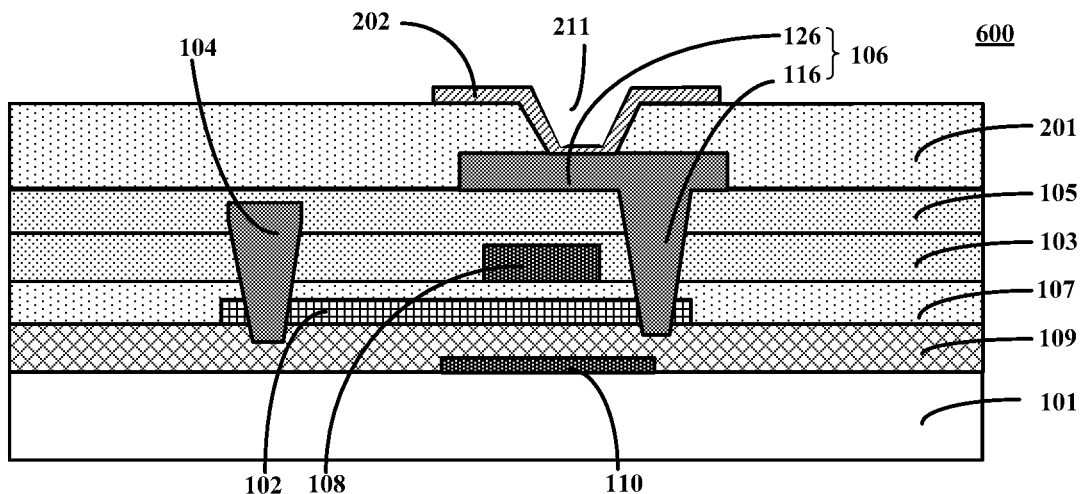
FIG. 6 is a schematic structural view showing an array substrate according to one embodiment of the present disclosure.

FIG. 6 is a schematic structural view showing an array substrate according to one embodiment of the present disclosure.

As shown in FIG. 6, the array substrate 600 comprises a thin film transistor (for example, a thin film transistor 100/200/300/400/500) provided according to any one of the above embodiments.

In some embodiments, the array substrate 600 may further comprise a planarization layer 201 and a first electrode 202.

The planarization layer 201 is located on one side of the second interlayer dielectric layer 105 of the thin film transistor (for example, the thin film transistor 400) away from the first interlayer dielectric layer 103. The planarization layer 201 defines an opening 211 that exposes a part of the second portion 126 of the drain 106 of the thin film transistor 400. That is, the opening 211 is connected to the second portion 126. The material of the planarization layer 201 may comprise, for example, a resin material.

The first electrode 202 is at least partially located in the opening 211, and in contact with the second portion 126. For example, one part of the first electrode 202 is located on the bottom and the sidewall of the opening 211, and the other part of the first electrode 202 is located on the planarization layer 201.

In some embodiments, the first electrode 202 may be an anode. In this case, the array substrate may further comprise a pixel definition layer partially covering the first electrode 202.

In other embodiments, the first electrode 202 may be a pixel electrode. In some embodiments, the array substrate may further comprise a common electrode (to be described later in conjunction with FIG. 7). In other embodiments, the array substrate may also exclude a common electrode. For example, the common electrode may be disposed in a color filter substrate.

Figure 7:
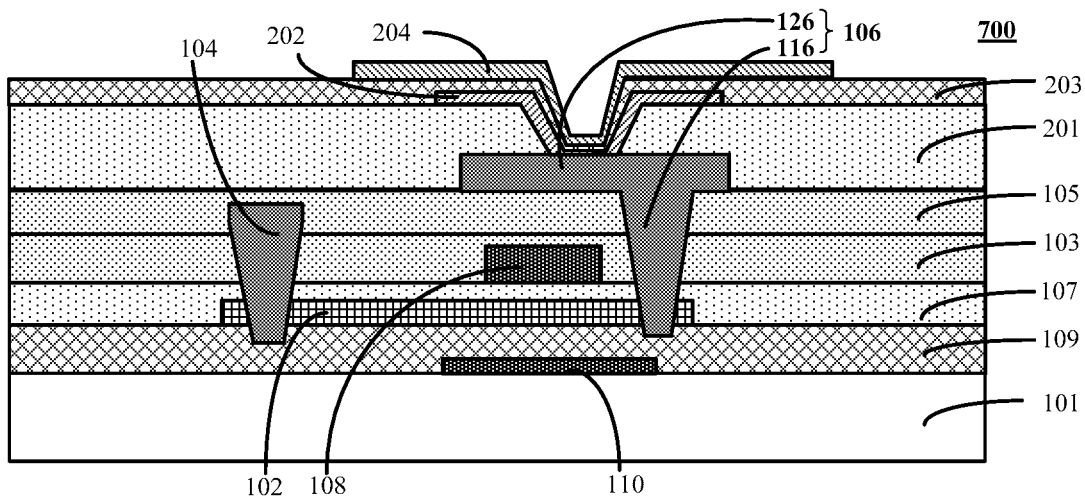
FIG. 7 is a schematic structural view showing an array substrate according to another embodiment of the present disclosure.

FIG. 7 is a schematic structural view showing an array substrate according to another embodiment of the present disclosure.

Compared to the array substrate 600 shown in FIG. 6, the array substrate 700 shown in FIG. 7 further comprises an insulation layer 203 and a common electrode 204. The insulation layer 203 is located on one side of the first electrode 202 away from the second portion 126, and the common electrode 204 is located on one side of the insulation layer 203 away from the first electrode 202. The insulation layer 203 isolates the first electrode 202 from the common electrode 204 to make the first electrode 202 be insulated from the common electrode 204. In some embodiments, the insulation layer 203 may cover a part of the planarization layer 201. For example, the material of the insulation layer 203 may comprise silicon nitride and the like.

The embodiments of the present disclosure also provide a display device. The display device may comprise the array substrate 600/700 according to any one of the above embodiments. In some embodiments, the display device may be, for example, any other product or member having a display function such as a display panel, a mobile terminal, a television, a display, a notebook computer, a digital photo frame, a navigator, an electronic paper, or a VR system.

In some embodiments, the display device may be an Organic Light-Emitting Diode (OLED) display panel. In other embodiments, the display device may be a liquid crystal display panel. Since the source and drain of the thin film transistor in the display panel are located in different layers, the occurrence of a poor display phenomenon such as dark spots caused by the overlap between the source and the drain is reduced, and the display effect of the display panel is improved.

Figure 8:
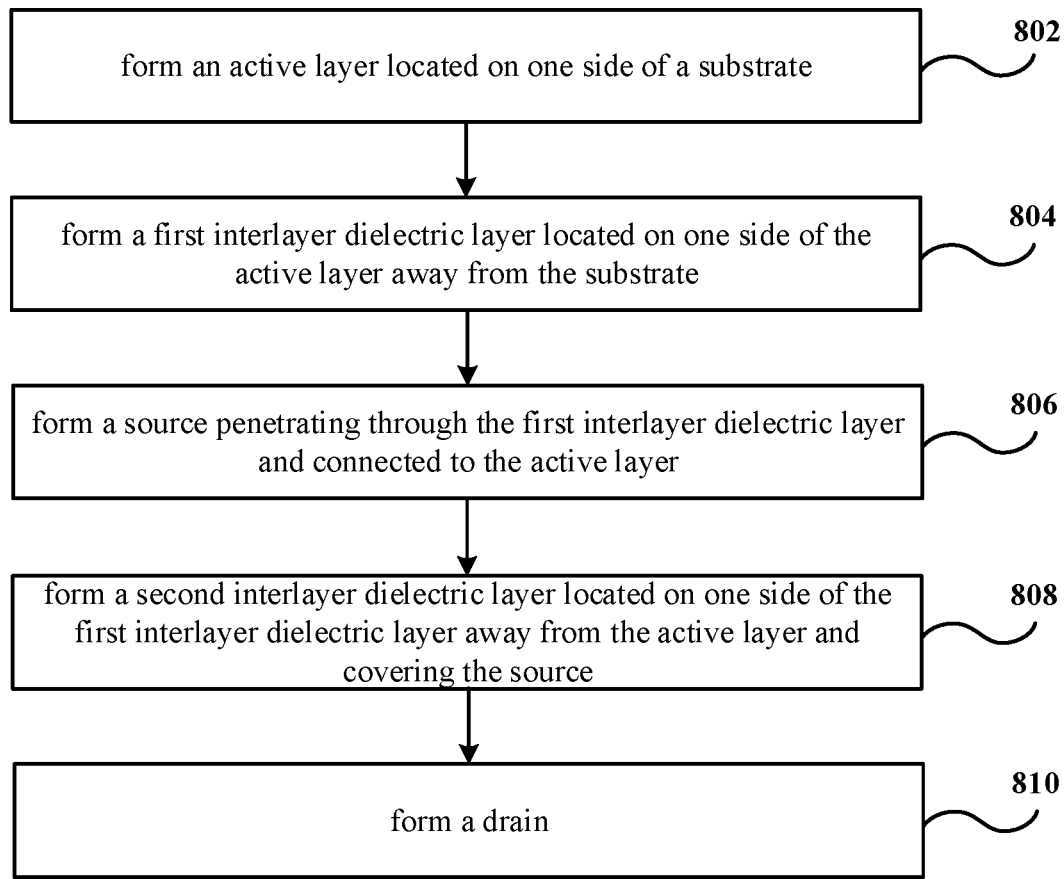
FIG. 8 is a schematic flow chart of a method for manufacturing a thin film transistor according to one embodiment of the present disclosure.

FIG. 8 is a schematic flow chart showing a method for manufacturing a thin film transistor according to one embodiment of the present disclosure. FIGS. 9A-9G are schematic cross-sectional views showing structures obtained at different stages of forming a thin film transistor according to some embodiments of the present disclosure. The process of forming a thin film transistor according to some embodiments of the present disclosure is described below in conjunction with FIGS. 8 and 9A to 9G.

Figure 9A:
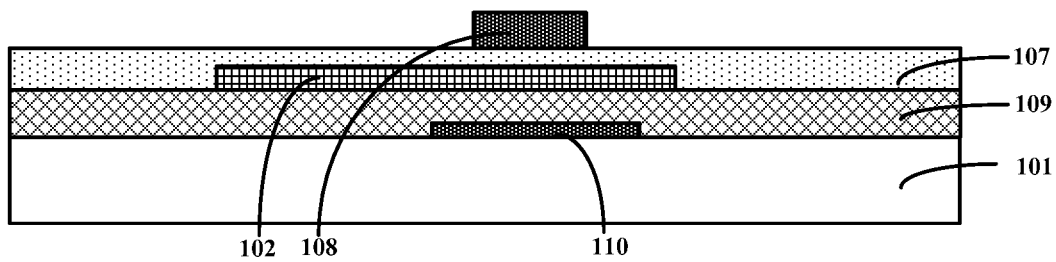
FIGS. 9A-9G are schematic cross-sectional views showing structures obtained at different stages of forming a thin film transistor according to some embodiments of the present disclosure.

At step 802, an active layer 102 located on one side of the substrate 101 is formed, as shown in FIG. 9A.

In some implementations, a buffer layer 109 is formed first on one side of the substrate 101, and then an active layer 102 is formed on one side of the buffer layer 109 away from the substrate 101. In other implementations, a light shielding layer 110 on one side of the substrate 101 is formed first, a buffer layer 109 located on one side of the substrate 101 and covering the light shielding layer 110 is formed, and then an active layer 102 is formed on one side of the buffer layer 109 away from the substrate 101. Here, the orthographic projection of the active layer 102 on the substrate 101 at least partially overlaps with that of the light shielding layer 110 on the substrate 101.

In some embodiments, referring to FIG. 9A, after the active layer 102 on one side of the substrate 101 is formed, a gate dielectric layer 107 is formed on one side of the active layer 102 away from the substrate 101, and then a gate 108 is formed on one side of the gate dielectric layer 107 away from the active layer 102. In this way, a top-gate type thin film transistor can be formed. In some implementations, the gate dielectric layer 107 may cover the active layer 102.

In other embodiments, before the active layer 102 on one side of the substrate 101 is formed, a gate is formed on one side of the substrate 101, and then a gate dielectric layer is formed on one side of the gate away from the substrate 101. In this way, a bottom-gate type thin film transistor may be formed.

Figure 9B:
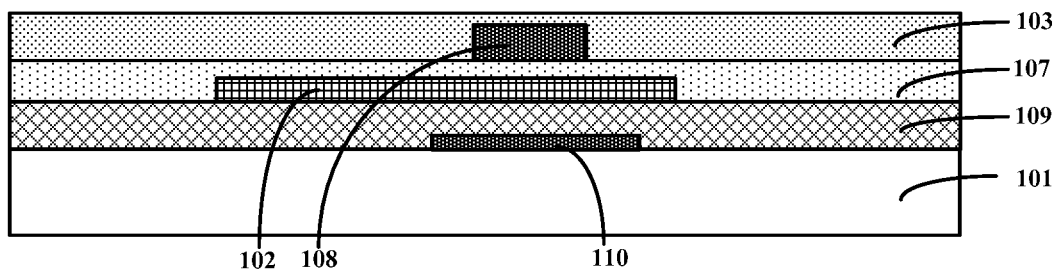

At step 804, a first interlayer dielectric layer 103 located on one side of the active layer 102 away from the substrate 101 is formed, as shown in FIG. 9B. In some embodiments, the first interlayer dielectric layer 103 may be located on one side of the gate dielectric layer 107 away from the substrate 101 and cover the gate 108.

At step 806, a source 104 penetrating through the first interlayer dielectric layer 103 and connected to the active layer 102 is formed.

Figure 9C:
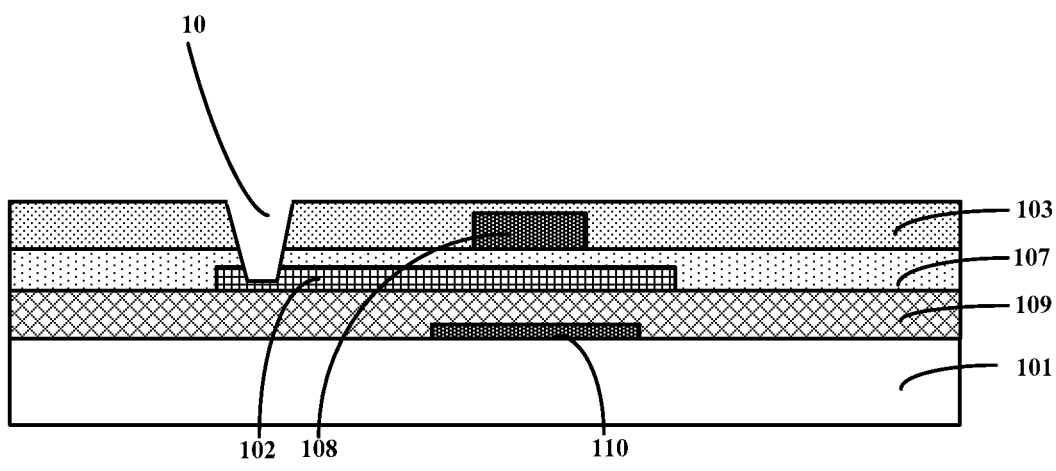
Figure 9D:
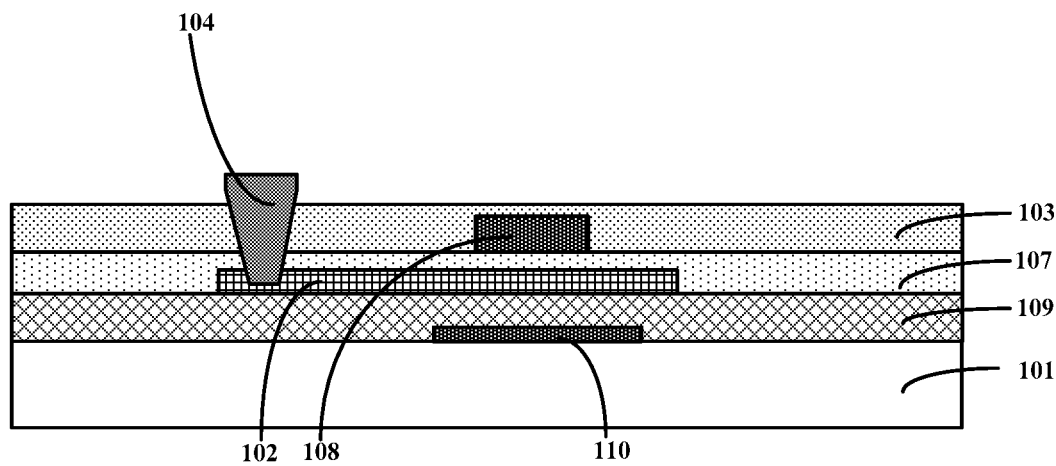

For example, a first opening 10 penetrating through the first interlayer dielectric layer 103 is formed first. The first opening 10 exposes a part of the active layer 102, as shown in FIG. 9C. In some implementations, the first opening 10 exposes an upper surface of the active layer 102. In other implementations, the first opening 10 may extend to be under the upper surface of the active layer 102. For example, a suitable etchant may be used to etch the first interlayer dielectric layer 103 and the active layer 102 respectively to form the first opening 10. Then, a source 104 at least partially located in the first opening 10 and in contact with the active layer 102 is formed, as shown in FIG. 9D.

In some embodiments, in the case where the buffer layer 109 is formed, the first opening 10 may extend into the buffer layer 109. That is, the active layer 102 may be over-etched to reduce the process difficulty. In this case, the source 104 may extend into the buffer layer 109.

Figure 9E:
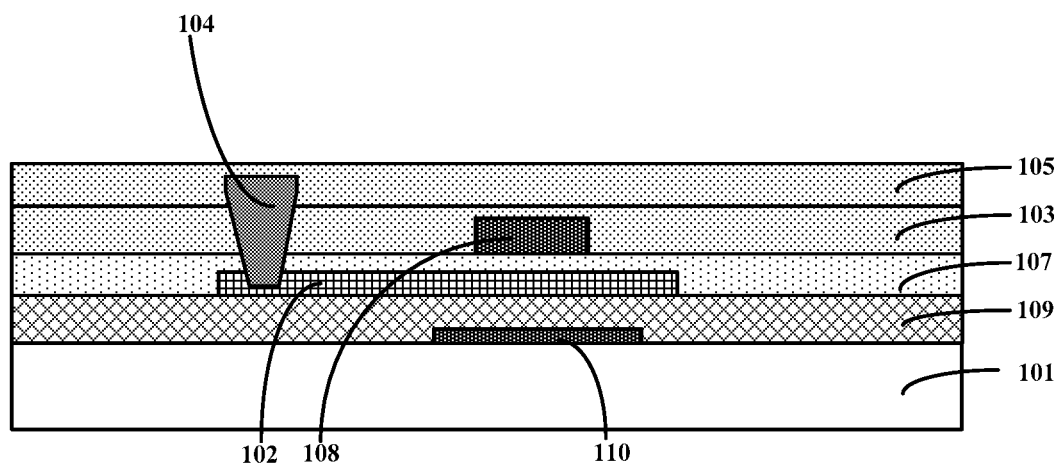

At step 808, a second interlayer dielectric layer 105 located on one side of the first interlayer dielectric layer 103 away from the active layer 102 and covering the source 104 is formed, as shown in FIG. 9E.

At step 810, a drain 106 is formed to form a thin film transistor. Here, the drain 106 at least comprises a first portion 116. The first portion 116 penetrates through the second interlayer dielectric layer 105 and the first interlayer dielectric layer 103 and is connected to the active layer 102. In some embodiments, the drain 106 further comprises a second portion 126 connected to the first portion 116. The second portion 126 is located on one side of the second interlayer dielectric layer 105 away from the first interlayer dielectric layer 103. In some embodiments, the orthographic projection of the second portion 126 on the substrate 101 partially overlaps with that of the source 104 on the substrate 101.

Figure 9F:
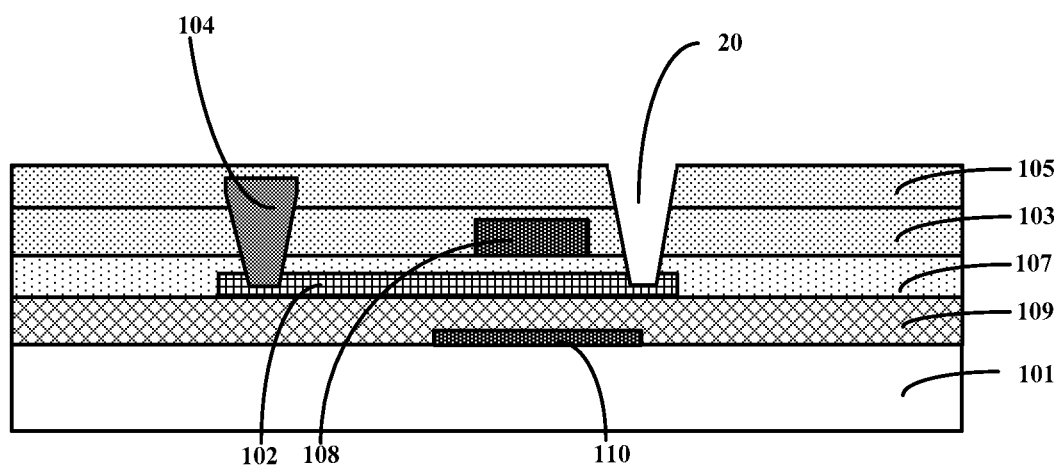
Figure 9G:
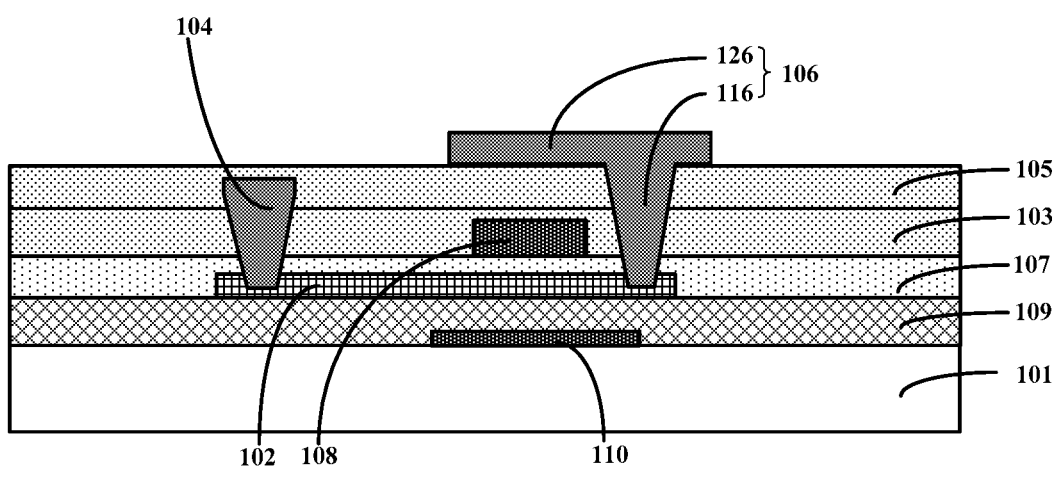

For example, a second opening 20 penetrating through the second interlayer dielectric layer 105 and the first interlayer dielectric layer 103 is formed first. The second opening 20 exposes a part of the active layer 102 as shown in FIG. 9F. In some implementations, the second opening 20 exposes the upper surface of the active layer 102. In other implementations, the second opening 20 may extend to be under the upper surface of the active layer 102. Then, the drain 106 is formed, as shown in FIG. 9G. Here, the first portion 116 of the drain 106 is located in the second opening 20, and in contact with the active layer 102.

In some embodiments, in the case where the buffer layer 109 is formed, the second opening 20 may extend into the buffer layer 109. That is, the active layer 102 may be over-etched to reduce the process difficulty. In this case, the first portion 116 may extend into the buffer layer 109.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. An array substrate, comprising a thin film transistor, wherein the thin film transistor comprises:
    an active layer and a gate which are located on one side of a substrate;
    a first interlayer dielectric layer located on one side of the active layer away from the substrate;
    a source penetrating through the first interlayer dielectric layer, and connected to the active layer;
    a second interlayer dielectric layer located on one side of the first interlayer dielectric layer away from the active layer and covering the source; and
    a drain, wherein the drain comprises a first portion penetrating through the second interlayer dielectric layer and the first interlayer dielectric layer and connected to the active layer, and a second portion connected to the first portion and located on one side of the second interlayer dielectric layer away from the first interlayer dielectric layer, wherein an orthographic projection of the gate on the substrate is within an orthographic projection of the second portion on the substrate,
    wherein the array substrate further comprises:
    a planarization layer located on one side of the second interlayer dielectric layer away from the first interlayer dielectric layer, wherein the planarization layer defines an opening extending to the second portion of the drain, wherein an orthographic projection of the opening on the substrate overlaps with the orthographic projection of the gate on the substrate; and
    a first electrode is at least partially located in the opening and in contact with the second portion of the drain, wherein a part of the second portion in contact with the first electrode is located on one side of the first portion close to the source.

2. The array substrate according to claim 1, wherein the first electrode is a pixel electrode;
    wherein the array substrate further comprises:
    an insulation layer located on one side of the first electrode away from the second portion of the drain; and
    a common electrode located on one side of the insulation layer away from the first electrode.

3. The array substrate according to claim 1, wherein the first electrode is an anode.

4. A display device, comprising: the array substrate according to claim 1.

5. A method for manufacturing an array substrate, comprising:
forming an active layer and a gate located on one side of a substrate;
forming a first interlayer dielectric layer located on one side of the active layer away from the substrate;
forming a first opening penetrating through the first interlayer dielectric layer, wherein the first opening exposes a first part of the active layer;
forming a source at least partially located in the first opening and in contact with the active layer;
forming a second interlayer dielectric layer located on one side of the first interlayer dielectric layer away from the active layer and covering the source;
forming a drain, wherein the drain comprises a first portion penetrating through the second interlayer dielectric layer and the first interlayer dielectric layer and connected to the active layer, and a second portion connected to the first portion and located on one side of the second interlayer dielectric layer away from the first interlayer dielectric layer, wherein an orthographic projection of the gate on the substrate is within an orthographic projection of the second portion on the substrate;
forming a planarization layer on one side of the second interlayer dielectric layer away from the first interlayer dielectric layer, wherein the planarization layer defines an opening extending to the second portion of the drain, wherein an orthographic projection of the opening on the substrate overlaps with the orthographic projection of the gate on the substrate; and
forming a first electrode at least partially located in the opening and in contact with the second portion of the drain, wherein a part of the second portion in contact with the first electrode is located on one side of the first portion close to the source.

6. The method according to claim 5, wherein forming the drain comprises:
forming a second opening penetrating through the second interlayer dielectric layer and the first interlayer dielectric layer, wherein the second opening exposes a second part of the active layer;
forming the drain, wherein the first portion of the drain is located in the second opening and in contact with the active layer.

7. The method according to claim 6, wherein forming the active layer located on the one side of the substrate comprises:
forming a buffer layer located on the one side of the substrate;
forming the active layer on one side of the buffer layer away from the substrate;
wherein at least one of the source or the first portion of the drain extends into the buffer layer.

8. The method according to claim 7, wherein forming the buffer layer located on the one side of the substrate comprises:
forming a light shielding layer located on the one side of the substrate;
forming the buffer layer located on the one side of the substrate and covering the light shielding layer;
wherein an orthographic projection of the active layer on the substrate at least partially overlaps with an orthographic projection of the light shielding layer on the substrate.

9. The method according to claim 8, further comprising:
forming a gate dielectric layer on one side of the active layer away from the substrate; and
forming the on one side of the gate dielectric layer away from the active layer;
wherein the first interlayer dielectric layer is located on one side of the gate dielectric layer away from the substrate and covers the gate.

10. The array substrate according to claim 1, wherein the orthographic projection of the second portion on the substrate partially overlaps with an orthographic projection of the source on the substrate.

11. The array substrate according to claim 1, wherein the active layer defines at least one of a first recess or a second recess, wherein:
the source is in contact with a bottom surface and a side surface of the first recess, and the first portion of the drain is in contact with a bottom surface and a side surface of the second recess.

12. The array substrate according to claim 1, further comprising a buffer layer located between the substrate and the active layer, wherein at least one of the source or the first portion of the drain extends into the buffer layer.

13. The array substrate according to claim 12, further comprising:
a light shielding layer located between the substrate and the buffer layer;
wherein an orthographic projection of the active layer on the substrate at least partially overlaps with an orthographic projection of the light shielding layer on the substrate.

14. The array substrate according to claim 13, wherein the thin film transistor comprises a gate dielectric layer, wherein:
the gate dielectric layer is located on one side of the active layer away from the substrate;
the gate is located on one side of the gate dielectric layer away from the active layer; and
the first interlayer dielectric layer is located on one side of the gate dielectric layer away from the substrate and covers the gate.

15. The array substrate according to claim 1, wherein a material of the active layer comprises polysilicon.

* * * * *

UNITED STATES PATENT AND TRADEMARK OFFICE
CERTIFICATE OF CORRECTION

PATENT NO. : 11,121,226 B2
APPLICATION NO. : 16/632179
DATED : September 14, 2021
INVENTOR(S) : Lei Yan et al.

Page 1 of 1

It is certified that error appears in the above-identified patent and that said Letters Patent is hereby corrected as shown below:

In the Claims

Column 12, Line 16, Claim 9, after "forming the" insert -- gate --

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*